US011363750B2

(12) United States Patent
Pfaffinger et al.

(10) Patent No.: US 11,363,750 B2
(45) Date of Patent: Jun. 14, 2022

(54) METHOD AND CONTROL DEVICE FOR THE THROUGHPUT-OPTIMISED PRODUCTION OF PRINTED CIRCUIT BOARDS ON A PICK-AND-PLACE LINE

(71) Applicant: Siemens Aktiengesellschaft, Munich (DE)

(72) Inventors: Alexander Pfaffinger, Munich (DE); Christian Royer, Ottobrunn (DE)

(73) Assignee: SIEMENS AKTIENGESELLSCHAFT

( * ) Notice: Subject to any disclaimer, the term of this patent is extended or adjusted under 35 U.S.C. 154(b) by 391 days.

(21) Appl. No.: 16/481,125

(22) PCT Filed: Jan. 31, 2017

(86) PCT No.: PCT/EP2017/051997
§ 371 (c)(1),
(2) Date: Jul. 26, 2019

(87) PCT Pub. No.: WO2018/141356
PCT Pub. Date: Aug. 9, 2018

(65) Prior Publication Data
US 2021/0136968 A1 May 6, 2021

(51) Int. Cl.
*H05K 13/08* (2006.01)
*G05B 19/418* (2006.01)

(52) U.S. Cl.
CPC ..... *H05K 13/085* (2018.08); *G05B 19/41865* (2013.01); *G05B 2219/45026* (2013.01)

(58) Field of Classification Search
CPC .......... H05K 13/085; G05B 19/41865; G05B 2219/45026
(Continued)

(56) References Cited

U.S. PATENT DOCUMENTS 6,104,965 A 8/2000 Lim et al.
6,145,190 A 11/2000 Shin et al.
(Continued)

FOREIGN PATENT DOCUMENTS

CN 1466864 A 1/2004
CN 101374405 A 2/2009
(Continued)

OTHER PUBLICATIONS

PCT International Search Report dated Oct. 19, 2017 and corresponding to PCT International Application No. PCT/EP2017/051997 filed Jan. 31, 2017.
(Continued)

*Primary Examiner* — Robert A Cassity
(74) *Attorney, Agent, or Firm* — Schmeiser, Olsen & Watts LLP (57) ABSTRACT

A method and a control device for the throughput-optimized production of printed circuit boards on a pick-and-place line is provided. Further provided is a method for the throughput-optimized production of printed circuit boards on a pick-and-place line, wherein: the printed circuit boards are divided into groups known as clusters; each cluster is produced using one set-up; the set-up is realized by changing tables that can be attached to the pick-and-place line, each changing table having at least one feed device for keeping ready stocks of components; a quantity of changing tables needed for each set-up is referred to as a changing table set and an empty changing table set includes changing tables having feed devices that are empty.

7 Claims, 2 Drawing Sheets

(58) Field of Classification Search
USPC .......................................................... 700/121
See application file for complete search history.

(56) References Cited

U.S. PATENT DOCUMENTS

| | | | |
|---|---|---|---|
| 2004/0073322 A1* | 4/2004 | Maenishi | H05K 13/0452 700/28 |
| 2005/0288806 A1 | 12/2005 | Yamazaki et al. | |
| 2006/0052893 A1 | 3/2006 | Yamazaki et al. | |
| 2009/0049682 A1 | 2/2009 | Yagi et al. | |
| 2012/0004762 A1 | 1/2012 | Bauer et al. | |
| 2013/0180829 A1 | 7/2013 | Doyle | |
| 2015/0083336 A1 | 3/2015 | Okada et al. | |
| 2015/0135505 A1* | 5/2015 | Royer | H05K 13/085 29/428 |
| 2015/0160648 A1* | 6/2015 | Craiovan | H05K 13/085 700/121 |
| 2015/0195965 A1 | 7/2015 | Craiovan et al. | |
| 2015/0195966 A1 | 7/2015 | Pfaffinger et al. | |
| 2015/0239229 A1 | 8/2015 | Murakami et al. | |
| 2015/0296671 A1* | 10/2015 | Pfaffinger | H05K 13/08 29/830 |
| 2017/0311491 A1 | 10/2017 | Pfaffinger et al. | |
| 2017/0318716 A1 | 11/2017 | Pfaffinger et al. | |
| 2017/0374745 A1 | 12/2017 | Pfaffinger et al. | |
| 2018/0324991 A1 | 11/2018 | Pfaffinger et al. | |

FOREIGN PATENT DOCUMENTS

| | | | |
|---|---|---|---|
| CN | 102281959 A | 12/2011 | |
| CN | 102356707 A | 2/2012 | |
| CN | 203210829 U | 9/2013 | |
| CN | 103391709 A | 11/2013 | |
| CN | 104396362 A | 3/2015 | |
| CN | 104412284 A | 3/2015 | |
| CN | 104412729 A | 3/2015 | |
| CN | 104412733 A | 3/2015 | |
| CN | 104470347 A | 3/2015 | |
| CN | 104869797 A | 8/2015 | |
| DE | 102012221259 A1 | 5/2014 | |
| DE | 102014222936 A1 | 5/2016 | |
| DE | 102014225713 A1 | 6/2016 | |
| DE | 102015200420 A1 | 7/2016 | |
| JP | H0715187 A | 1/1995 | |
| WO | 2004107838 A1 | 12/2004 | |
| WO | 2013167276 A1 | 11/2013 | |
| WO | 2014079601 A1 | 5/2014 | |
| WO | 2016074857 A1 | 5/2016 | |

OTHER PUBLICATIONS

Liu Ying:"Optimization on Scheduling for Printed Circuit Boards Assembly Lines"; Dissertation Submitted to Dalian Maritime University; Sep. 2012; Management Science and Enigneering.

Fidan, Ismail et al:"Integrated User Interface Design for Electronics Remanufacturing Systems"; 1999 IEEE/CPMI Int. Electronics Manufacturing Technology Symposium; Cat. No. 99CH36330.

Chinese Decision to Grant Patent Right for Invention for Application No. 201780085238.0, dated Feb. 10, 2021.

Mon-English Chinese Office Action for Application No. 201780085238.0, dated Jun. 2, 2020.

* cited by examiner

METHOD AND CONTROL DEVICE FOR THE THROUGHPUT-OPTIMISED PRODUCTION OF PRINTED CIRCUIT BOARDS ON A PICK-AND-PLACE LINE

CROSS-REFERENCE TO RELATED APPLICATIONS

This application claims priority to PCT Application No. PCT/EP2017/051997, having a filing date of Jan. 31, 2017, the entire contents of which are hereby incorporated by reference.

FIELD OF TECHNOLOGY

The following relates to a method for throughput-optimized production of printed circuit boards on a pick-and-place line. Furthermore, embodiments of the invention relate to a control device for a pick-and-place system or a production or assembly line for the pick-and-place of printed circuit boards (assemblies) with components or component parts. Embodiments of the invention also relates to a computer program product.

BACKGROUND

In particular in the field of electronics products, printed circuit boards or assemblies to be fabricated are produced on SMT pick-and-place lines by surface mounting (surface mounted technology, SMT). One manufacturer of automatic SMT pick-and place machines and systems having the product name SIPLACE is, for example, the company ASM (http://www.siplace.com/en/Home).

Several automatic pick-and-place machines, which are usually connected by a transport system, and which cooperate, for example, to fabricate or to produce (electronic) components or printed circuit boards form a pick-and-place line.

In automatic pick-and-place machines, e.g. for picking and placing assemblies with components, changing tables for feed devices for components are arranged laterally on a transport section for the assembly.

The changing tables each comprise a plurality of feed devices. Each feed device holds in readiness a stock of components of a predetermined component type. For the components the feed device has a holding capacity (space capacity), that is usually expressed in tracks or track capacities.

Each feed device can be configured to hold in readiness different components and usually different feed devices can be mounted on a changing table. If a component of one component type is required on a specific automatic pick-and-place machine, which is not present in one of the changing tables, usually one of the mounted changing tables is not provided with the required components but is completely replaced for another, suitably equipped changing table. The setting up of a changing table to be changed with components is called pre-setup and can require a processing time in the range of hours.

Furthermore, it is known, for example, from electronics fabrication to combine the batches to be fabricated on a pick-and-place line into setup families. All the batches of one setup family are each fabricated with the same line setup. A setup family, also called cluster, comprises a quantity of batches, which can be fabricated within a setup. All the assemblies of one setup family can therefore be fabricated successively without refitting on the line.

A setup can be held on one or more setup tables, which can easily be exchanged on the automatic pick-and-place machine. However, a setting up of a setup table with components of predetermined component types is expensive—as already described above. The setups are therefore frequently divided into fixed setups and variant setups, wherein a fixed setup table is provided to retain its composition of component types over a predetermined planning period whereas a variant setup table is prospectively refitted within the planning period.

The typical setup operation on an SMT pick-and-place line within a short-term planning period, beginning with the planning as far as the execution, looks as follows: the duration of a short-term planning period is normally between one and five days. At the beginning of a planning period the production planner usually receives new fabrication orders from an EDP system. However, it also has a residual content of old fabrication orders, that have not yet been planned in, from the previous period. The orders are fulfilled, if possible, with existing fixed setups. Variable setups (also called variant setups) are created for the remainder.

While pick and place is taking place with an active setup on the pick-and-place line, in the pre-setup region, the next setup is already being prepared on a changing table set held in readiness for variable setups. A quantity of changing tables needed for each setup is here designated as changing table set. If the preparation takes too long, this results in a downtime of the pick-and-place line.

Refitting processes for changing the setup from one setup family to another setup family also involve downtimes of typically 30 min.

Downtimes of pick-and-place lines reduce the throughput of the pick-and-place line and should therefore be avoided at all costs.

In practice, the variable setups are usually created with a cluster tool such as, for example, SiCluster. The setup sequence ordered in a time sequence in the pre-setup region is at the present time created manually by the production planner.

SUMMARY

An aspect relates to optimize the throughput on a pick-and-place line.

Embodiments of the invention claims a method for throughput-optimized production of printed circuit boards on a pick-and-place line, wherein the printed circuit boards are divided into groups known as clusters, wherein each cluster is produced by means of a setup, wherein the setup is realized by means of changing tables that can be attached to the pick-and-place line, which changing tables each have at least one feed device for holding in readiness stocks of components, wherein a quantity of changing tables needed for each setup is designated as changing table set and an empty changing table set comprises changing tables whose feed devices are empty, wherein a setup is set up temporarily on empty changing table sets and after production of printed circuit boards is removed as a result of the picking and placing thereof, and wherein one of the changing table sets can only be put into production when it has been completely set up in a pre-setup region and the changing table set can then only be set up again when the production performed with the changing table set has ended and the changing table set has been removed again in the pre-setup region, wherein the method comprises the following steps:
a) recording a quantity of clusters,
b) recording a number of empty changing table sets,
c) recording the respective time duration for the creation of the setup for a cluster,
d) recording the respective production time duration for the fabrication of a cluster on the pick-and-place line,
e) selecting a sequence for use of the changing table sets for setting up in the pre-setup region with the aim of avoiding waiting times in production in which the same changing table sets are used for the production of printed circuit boards,
f) optimizing the sequence of the clusters taking into account the selected sequence for use of the changing table sets so that the throughput on the pick-and-place line will be or is maximized,
g) carrying out the production of the printed circuit boards with the aid of the optimized sequence of clusters.

An empty changing table set usually comprises non-setup or not yet setup changing tables. The feed devices in this case are empty and not yet set up with components for pick and place.

The changing table sets can in this case each be assigned to positions in a time sequence, in which the changing table sets are set up in the pre-setup region and used or employed in the same time sequence in production.

Embodiments of the invention brings with it the advantage that the throughput in printed circuit board production can be increased. Optimal calculations for the aforesaid sequence are possible, whereby inter alia an automated support in the production planning is achieved.

A further development of embodiments of the invention provides further following process steps:
recording one or more earliest possible time points for the beginning of the use of a changing table set,
recording an earliest possible time point for the beginning of production
recording an earliest possible time point for the beginning of setting up in the pre-setup region, and
optimizing the said sequence of clusters taking into account the recorded earliest time points.

The waiting time that occurs because it is necessary to wait until the changing table set in the pre-setup region has been completely set up before a changing table set can be employed or used in production can thus be reduced.

A further development of embodiments of the invention provides that the optimization of the sequence of clusters is performed with the aid of mixed integer linear optimization.

A further development of embodiments of the invention provides that different types of setups are used, wherein a first type corresponds to a fixed setup, which remains unchanged after a single setting up and is not removed or set up prior to production. One changing table set is provided per fixed setup. A second type corresponds to a variant setup that can be varied—as explained initially. At least one changing table set is provided for the variant setups. Each cluster is fabricated or produced with a setup of a predefinable type of the said types.

A further development of embodiments of the invention provides that, in addition, refitting times are recorded and taken into account for the optimization, which refitting times occur due to the changing of the changing table sets on transition from one setup to another setup.

In order to improve the throughput, one or more clusters with fixed setups can be skillfully inserted in the production between the clusters with variant setups.

A further development of embodiments of the invention provides that a cluster with a fixed setup can be divided and can be introduced multiple times into the sequence of clusters.

In addition, a cluster having a fixed setup can be introduced into the sequence of clusters at the beginning and/or at the end.

A further aspect of embodiments of the invention provides a control device, in particular for carrying out the method for throughput-optimized production of printed circuit boards on a pick-and-place line, wherein the printed circuit boards can be divided into groups known as clusters, wherein each cluster is fabricated by means of a setup, wherein the setup can be realized by means of changing tables that can be attached to the pick-and-place line, which changing tables each have at least one feed device for holding in readiness stocks of components, wherein a quantity of changing tables needed for each setup is designated as changing table set and an empty changing table set comprises changing tables whose feed devices are empty, wherein a setup can be set up temporarily on empty changing table sets and after production of printed circuit boards can be removed as a result of the picking and placing thereof, and
wherein one of the changing table sets can only be put into production when it has been completely set up in a pre-setup region and the changing table set can then only be set up again when the production performed with the changing table set has ended and the changing table set has been removed again in the pre-setup region, wherein the control unit comprises the following recording devices
a) for recording a quantity of clusters,
b) for recording a number of empty changing table sets,
c) for recording the respective time duration for the creation of the setup for a cluster,
d) for recording the respective production time duration for the fabrication of a cluster on the pick-and-place line,
e) for selecting a sequence for use of the changing table sets for setting up in the pre-setup region with the aim of avoiding waiting times in production in which the same changing table sets can be used for the production of printed circuit boards, and
f) an optimizer or means for optimizing the sequence of the clusters taking into account the selected sequence for use of the changing table sets so that the throughput on the pick-and-place line is maximized, as well as
g) a producer or means for carrying out the production of the printed circuit boards with the aid of the optimized sequence of clusters.

The control device can provide means and/or units or devices and/or modules for carrying out the above-mentioned method, which can each be manifest as hardware and/or firmware and/or software or as a computer program or a computer program product (non-transitory computer readable storage medium having instructions, which when executed by a processor, perform actions).

The control device can be further developed according to the method described above.

A further aspect of embodiments of the invention can be a pick-and-place system that has such a control device according to embodiments of the invention.

This pick-and-place system can be part of an installation.

The installation can inter alia be characterized by one of the following types of installation. Examples for this are:
an automated installation or
a fabrication or production installation.

A further aspect of embodiments of the invention is a computer program product or a computer program with means for carrying out the aforesaid method when the computer program (product) is executed in an aforesaid control device or in means of the device. The computer program or product can be stored on a computer-readable medium. The computer program or product can be created in a usual programming language (e.g. C++, Java). The processing device can comprise a customary computer or server with appropriate input, output, and storage means. This processing device can be integrated in the control device or in means thereof.

BRIEF DESCRIPTION OF THE DRAWINGS

Some of the embodiments will be described in detail, with reference to the following figures, wherein like designations denote like members, wherein.

DETAILED DESCRIPTION

Figure 1:
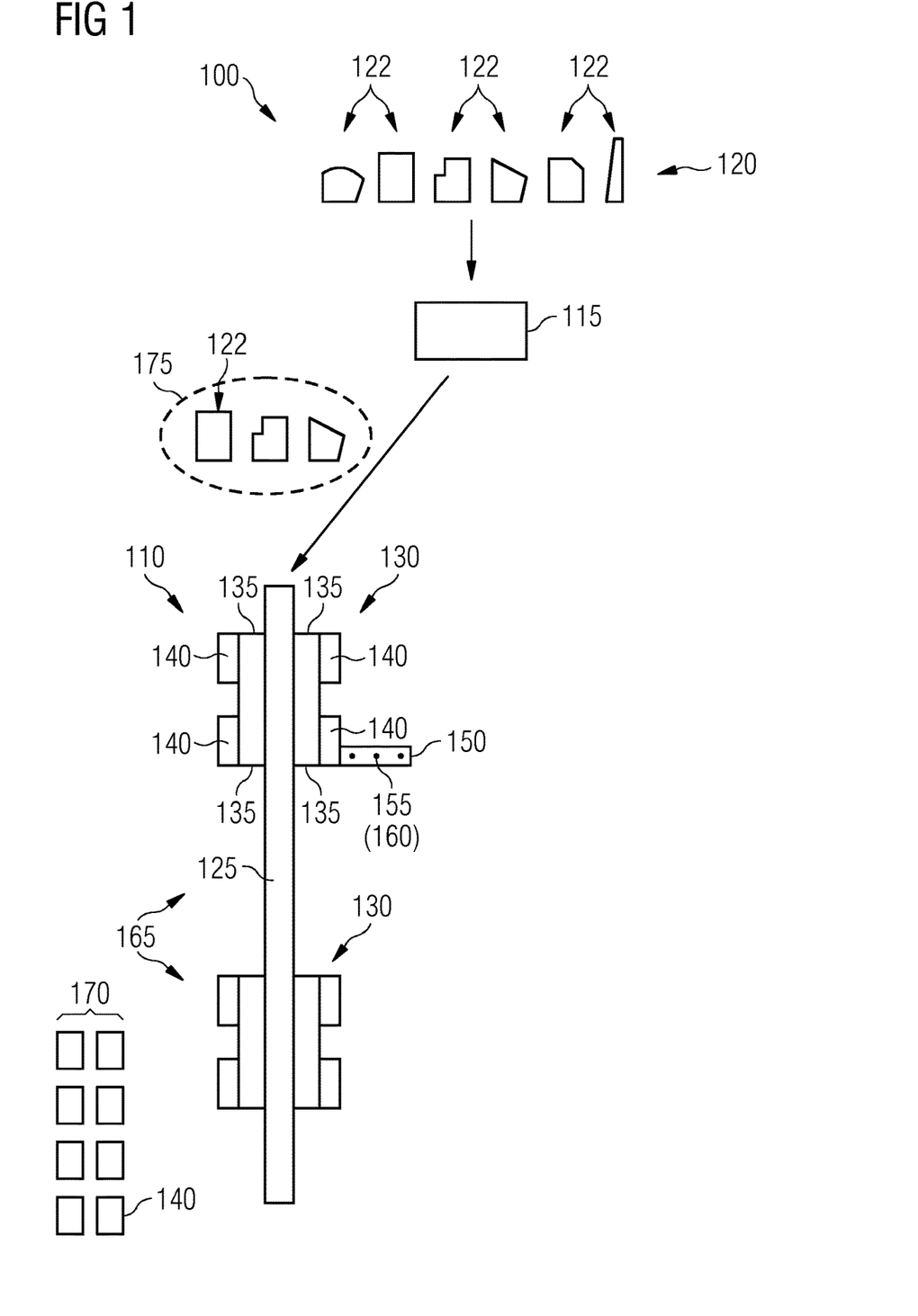
FIG. 1 shows a pick-and-place system.

FIG. 1 shows an exemplary pick-and-place system 100. The pick-and-place system 100 comprises one or more pick-and-place lines 110 and a processing or control device 115. Each pick-and-place line 110 comprises an optional transport system 125 as well as one or more automatic pick-and-place machines 130. Each automatic pick-and-place machine 130 comprises one or more pick-and-place heads 135, which are each adapted to receive components 155 from a setup table 140 and position them at a predetermined location on the printed circuit board 120, which is located on the transport system 125. During the pick-and-place process, the printed circuit board 120 is usually stationary in relation to the automatic pick-and-place machine 130.

The setup tables 140 each comprise a plurality of feed devices 150, of which only one is shown as an example in FIG. 1. Each feed device 150 holds in readiness a stock of components 155 of a predetermined component type 160. For the components 155 the feed device 150 usually has a holding capacity, which can be expressed in tracks. A track is usually 8 mm wide and the number of tracks of a setup table 140 is restricted, for example, to 40. Components 155 of the same component type 160 are usually provided in a belt, on a tray, or in a tube. Each component type 160 requires a predetermined number of tracks, which usually adjoin one another, on the feed device 150 and on the setup table 140.

Usually a feed device 150 can be configured to hold in readiness components 155 of different component types 160 and usually different feed devices 150 can be mounted on a setup table 140. In the present case, it is assumed for simplicity that a stock of components 155 of a component type 160 on a feed device 150 is almost infinitely large, therefore a retrofitting is not required.

If a component 155 of a component type 160, which is not present on one of the setup tables 140, is required on the automatic pick-and-place machine 130, usually the assignment of components 155 on one of the mounted setup tables 140 is not changed but the setup table 140 is completely exchanged for another suitably equipped setup table 140. The picking and placing of a setup table 140 not mounted on the pick-and-place line 110 with components 155 is called pre-setup and can require a processing time in the range of one or more hours, for example, about 6-8 hours.

Since a change of setup tables 140 on the pick-and-place line 110, a so-called setup change, is usually associated with a production stoppage, it is strived to make changes of setup tables 140 as rarely as possible. Since, furthermore, the setup tables 140 are costly and the refitting of a setup table 140 can be complex and tedious, it is further attempted to form as few setups as possible in order to fabricate a predetermined production quantity of printed circuit boards 120 of predetermined printed circuit board types 122. The production quantity here comprises a plurality of printed circuit board types 122, of which each predetermined number of printed circuit boards 120 should be equipped with components 155 of predetermined component types 160. For example, 300 printed circuit boards 120 of a first printed circuit board type 122 and 200 printed circuit boards 120 of a second printed circuit board type 122 can be picked and placed.

A setup 165, 170 comprises a quantity of component types 160 and is realized by one or more setup tables 140, which in the case of a plurality of setup tables form a changing table set and which are each equipped with stocks of components 155 of the component types 160 of the setup 165, 170 and are mounted on the pick-and-place line 110.

The setup 165, 170 is assigned a setup family 175, which comprises printed circuit board types 122, of which printed circuit boards 120 can be picked and placed by means of components 155 of the component types 160 of the setup 165, 170. A setup family 175 is assigned to precisely one setup 165, 170 and conversely.

In order to increase the utilization of a pick-and-place line 110 or reduce a requirement of setup tables 140, it is therefore crucial as to how setup families 175 are formed on the basis of the printed circuit board types 122 to be picked and placed. When forming setups 165, 170 or setup families 175, it may be necessary to observe auxiliary conditions, for example, the maintaining of a limited holding capacity of a setup table 140 for component types 160 or a grouping of predetermined printed circuit board types 160 in the same setup family 175, possibly for reasons of using lead-containing or lead-free tin solder.

The setups can be differentiated into fixed setups 165 and variant setups 170, wherein a fixed setup 165 is provided to remain set up unchanged on a number of changing tables 140 over a predetermined planning time while a changing table 140 of a variant setup 170 is prospectively refitted within the planning period with components 155 of different component types 160. The planning period can, for example, be 6 to 12 months. A variant setup 165 exists in a predetermined arrangement usually substantially shorter than the planning period, for example over several hours or days, but usually not over more than one week.

The setups 165, 170 can be exchanged if necessary on the pick-and-place line 110. In order to realize a fixed setup 165 or a variant setup 170, a setup table 140 is usually set up with stocks of components 155 of predetermined component types 160 while it is not mounted on the pick-and-place line 110. Already set-up components 155 of unrequired component types 160 can be removed beforehand. This refitting can comprise a considerable proportion of manual work and can be time-consuming.

In order to minimize the expenditure associated with a variant setup 170, an attempt is made to accommodate as many printed circuit board types 122 as possible in the fixed setups 165. However, a desired case without variant setups 170 is barely achievable in practice.

In the course of the control of the pick-and-place system 100, the control device 115 assigns printed circuit board types 122, whose assigned printed circuit boards 120 should be picked and placed on the pick-and-place line 110, to respectively one setup family 175, wherein fixed-setup setup families 175, which are each assigned to a fixed setup 165, and variant-setup setup families 175, which are each assigned to a variant setup 170, can be formed.

A special case of optimization methods is linear optimization. This is concerned with the optimization of linear objective functions over a set, which is restricted by linear equations and inequalities. This is the basis of the solution method of (mixed) integer linear optimization. A so-called solver is a collective designation for special mathematical computer programs, which can solve mathematical problems numerically. In connection with MILP (mixed integer linear programming), standard solvers such as, e.g. CPLEX, Scip, Gurobi, Xpress can be used for small IP programs (integer optimization models).

In the following an example is described, in which optimal time setup sequences are calculated by means of an MILP model (mixed integer linear programming) from predefined variable setup families to be fabricated. In addition, an optimal time sequence can be calculated for the use of set-up changing table sets (variant setup) and optionally fixed-setup changing table sets on the pick-and-place line.

The following is shown schematically in FIG. 2: in the first row positions in a specific time sequence are shown, hereinafter also called setup positions. The clusters with variable or variant setups R1, R2, R3, R4, R5 etc. are in this case assigned to the positions within the setup sequence (variant setup sequence). If there are five clusters with variable setups as in the example, there are also five positions (1, 2, 3, and 5) within the setup sequence onto which the clusters with variable setups (one-to-one) are assigned. A certain number of changing table sets is available for the creation of these clusters with variable setups. Usually there are two such changing table sets. One of the two changing table sets is available set up on the pick-and-place line. The other of the two changing table sets is located in the pre-setup region. The changing table sets are alternately assigned to the positions in advance, wherein the assignment is begun with the changing table set, which is available at the earliest time point.

In the second row in FIG. 2, the sequence with positions P1, P2, P3, P4, P5, etc., hereinafter called production positions, is shown on the pick-and-place line for the production of printed circuit boards, wherein the changing table sets are used in production in the same time sequence in which they had been completely set up. In FIG. 2 the arrows between the first and second row indicate which waiting relationships exist between positions 1 to 5. In other words, a changing table set must, for example, be completely set up at position R1 before it can be used in production at position P1.

Figure 2:
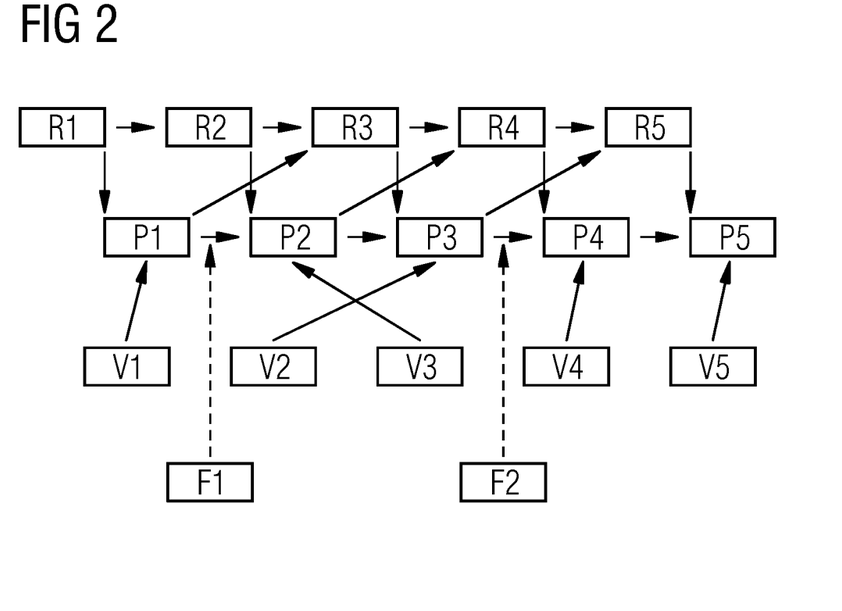
FIG. 2 shows a graphic showing the sequence of the setup processes in the pre-setup region and the sequence of the use of the setups in the production.

Clusters with variant setups V1 to V5 are shown in the third row of FIG. 2. The arrows between the second and the third row indicate assignments of clusters with variant setups to positions P1 to P5. It may be expedient, for example, to position the cluster with variant setup V3 at P2 and the cluster with variant setup V2 at P3, if the setup time (duration) for V3 is shorter than for V2. Thus, unnecessary waiting times or stoppage times in production would be avoided.

Furthermore, the fourth row of FIG. 2 shows clusters with fixed setups F1 and F2, which—as already described above—are each fixedly set up on two changing table sets. Therefore, no waiting times are obtained for the clusters with fixed setups, since the fixed setups are only set up once and then maintained for a longer (planning) period. The dashed arrows between the fourth and second row indicate that clusters with fixed setups can be inserted into the production sequence at "intermediate positions" or fitted in therebetween. This brings with it the advantage that waiting times in production for the completion of the necessary variant setups can be avoided in this way.

In the formulation of the MILP model, the following designations apply:

Indices:

| | |
|---|---|
| R | Set of setups to be completed/clusters to be produced |
| F | Set of clusters with fixed setups (F ⊂ R) |
| V | Set of clusters with variable setups (V ⊂ R) |
| P | Set of sequence positions for the clusters with variable setups, P = {1, . . . , \|V\|} |
| T | Set of empty changing table sets for the variant setups |
| $P_S$ | Set of positions sorted in ascending order at which changing table set s ∈ T is used |

Parameters:

| | |
|---|---|
| $PTime_r$ | Production time of cluster r including refitting time on the pick-and-place line |
| $RTime_r$ | Setup time for the creation of the setup of cluster r |
| $EarliestBegin_L$ | Earliest possible beginning of production on the pick-and-place line |
| $EarliestBegin_R$ | Earliest possible beginning of setting up in the pre-setup region |
| $EarliestBegin_S$ | Earliest possible use for changing table set s |

Binary Variables:

| | |
|---|---|
| $assign_{v,p}$ | Variable which specifies whether the cluster with variable setup v is inserted at p-th position of the production sequence for the clusters with variable setups (in this case, it has the value 1, otherwise the value 0). |
| $assignBefore_{f,p}$ | Variable which specifies at which intermediate position a cluster with fixed setup f is inserted, i.e. for p = 1 whether the cluster f is inserted before the first cluster with a variant setup, for 2 ≤ p ≤ \|P\| whether f is inserted before the p-th cluster with a variant setup and after the (p − 1)-th cluster with a variant setup, and for p = \|P\| + 1, whether the cluster with fixed setup is inserted after the last cluster with variant setup (in the respective cases it assumes the value 1, otherwise the value 0). |
| $begin_p^L$ | Beginning of fabrication or production with the cluster at p-th position of the variant setup sequence |
| $begin_p^V$ | Beginning of setup creation of the setup for the cluster at p-th position of the variant setup sequence in the pre-setup region |
| $end_p^L$ | End of fabrication of the cluster at p-th position of the variant setup sequence |
| $end_p^V$ | End of setup creation of the setup for the cluster at p-th position of the variant setup sequence in the pre-setup region |
| t | End time of the completion of all setups. |

IP Formulation:
Objective function:
  Minimize t
Auxiliary Conditions:
(1) Each cluster with variant setup must be assigned to a position.

$$\sum_{p \in P} assign_{v,p} = 1, v \in V$$

(2) Each position must be ascribed a cluster with variant setup.

$$\sum_{v \in V} assign_{v,p} = 1, p \in P$$

(3) Each cluster with fixed setup must be ascribed an intermediate position.

$$\sum_{p=1}^{|P|+1} assignBefore_{v,p} = 1, f \in F$$

(4) The production of a cluster with a variant setup at position p can only begin when the setup is created in the pre-setup region.

$$end_p^V \le begin_p^L, p \in P$$

(5) The setup process of a variant setup for the cluster at position p can only begin when the setup process of the variant setup for the cluster at position p−1 is completed.

$$end_{p-1}^V \le begin_p^V, p = 2, \ldots, |P|$$

(6) The setup process for the variant setup for the cluster at position p can only begin in the pre-setup region when the ascribed changing table set is free or empty.

$$end_p^L \le begin_{p'}^V, p' \text{ direct successor of } p' \text{ in } P_s, s \in T$$

(7) Allowance for the production times of the clusters with variant setups $$end_p^L = begin_p^L + \sum_{p \in P} PTime_v assign_{v,p}, v \in V$$

(8) Allowance for the setup times of the clusters with variant setups in the pre-setup region $$end_p^V = begin_p^V + \sum_{p \in P} RTime_v assign_{v,p}, v \in V$$

(9) The production with a cluster with variant setup at position p can only begin when the production of the cluster with variant setup at position p−1 and the production of a cluster with fixed setup between p−1 and p have been completed.

$$end_{p-1}^L + \sum_{f \in F} PTime_f assignBefore_{f,p} \le begin_p^L$$

$$p = 2, \ldots, |P|$$

(10) Production on the pick-and-place line can initially only begin when the pick-and-place line is available for this.

$$EarliestBegin_L + \sum_{f \in F} PTime_f assignBefore_{f,0} \le begin_1^L$$

(11) Setup creation in the pre-setup region can initially only begin when the pre-setup region is available for this.

$$EarliestBegin_T \le begin_1^V$$

(12) Setup creation in the pre-setup region for the first setup with changing table set s can only begin when the changing table set s is available for this.

$$EarliestBegin_s \le begin_p^V, p \text{ first element in } P_s$$

(13) Completion of all the setups is only accomplished when the last cluster with variant setup is finished and the following clusters with fixed setups are also finished.

$$t \ge end_{|P|}^L + \sum_{f \in F} PTime_f assignBefore_{f,|P|+1}$$

(14) Variable restrictions $$assign_{v,p} \in \{0,1\} v \in V, p \in P$$

$$assignBefore_{f,p} \in \{0,1\} f \in F, p = 1, \ldots, |P|+1$$

$$begin_p^L \ge 0, p \in P$$

$$begin_p^V \ge 0, p \in P$$

$$end_p^L \ge 0, p \in P$$

$$end_p^V \ge 0, p \in P$$

$$t \ge 0$$

The following further developments are possible:
a) Allowance for "non-present" refitting times:
  If the last cluster finished before the planning period is a cluster with fixed setup f' and a cluster with this fixed setup must also be completed in the planning period, the refitting time for this fixed setup can be saved if it is completed as the first one.
  The refitting time of f' is $UmruestT_{f'}$. In the MILP the restriction (10) should now be replaced by the following restriction:

$$EarliestBegin_L - UmruestT_{f'} assignBefore_{f',1} + \sum_{f \in F} PTime_f assignBefore_{f,0} \le begin_1^L$$

b) It is exemplary to complete clusters with fixed setup at the end:
  For the reason described in (1) it is additionally favorable to complete a cluster with a fixed setup at the end. To this end, the following objective function component can be incorporated with a small weighting in the minimization objective function:

$$-\sum_{f \in F} assignBefore_{f,|P|+1}$$

c) Possible division of a cluster with a fixed setup:

If waiting times occur in the optimal solution of the model, these can usually be avoided if it is assumed that a cluster with a fixed setup is not completed in one piece but can be divided into several parts which can each be inserted as buffers between clusters with variant setups. For each part a corresponding refitting time is then accumulated.

In the following therefore, the refitting times (times for changing the table sets) of the fixed setups are modelled separately and are not contained in the production times ProdT$_f$.

SetupT$_f$ Time for the one-off refitting to a cluster with fixed setup f

In addition, the following non-negative, continuous variables are required:

prodTime$_{f,p}$ Time for completion of the cluster with fixed setup f before the p-th cluster with variant setup The auxiliary conditions from (3) are then deleted since it is now allowed to divide a cluster with fixed setup.

In addition, the following auxiliary conditions are required:

(15) The production times for subclusters with fixed setup f must in total precisely correspond to the production time of f.

$$\sum_{p=1}^{|P|+1} prodTime_{f,p} = PTime_f \quad f \in F$$

(16) Only if a cluster with fixed setup is ascribed to an intermediate time interval, may a part thereof also be produced in this period.

$$PTime_f \cdot assignBefore_{f,p} \geq prodTime_{f,p}, f \in F, p=1, \ldots, |P|+1$$

(17) The auxiliary conditions from (9) are replaced by the following auxiliary conditions since the refitting times are now explicitly taken into account.

$$end_{p-1}^L + \sum_{f \in F} (SetupT_f assignBefore_{f,p} + prodTime_{f,p}) \leq begin_p^L$$

$$p = 1, \ldots, |P| + 1$$

(18) The auxiliary condition (10) is replaced by the following auxiliary conditions:

$$EarliestBegin_L + \sum_{f \in F} (SetupT_f assignBefore_{f,0} + prodTime_{f,0}) \leq begin_1^L$$

(19) The auxiliary condition (13) is replaced by the following auxiliary condition:

$$t \geq end_{|P|}^L + \sum_{f \in F} (SetupT_f assignBefore_{f,|P|+1} + prodTime_{f,|P|+1})$$

Figure 3:
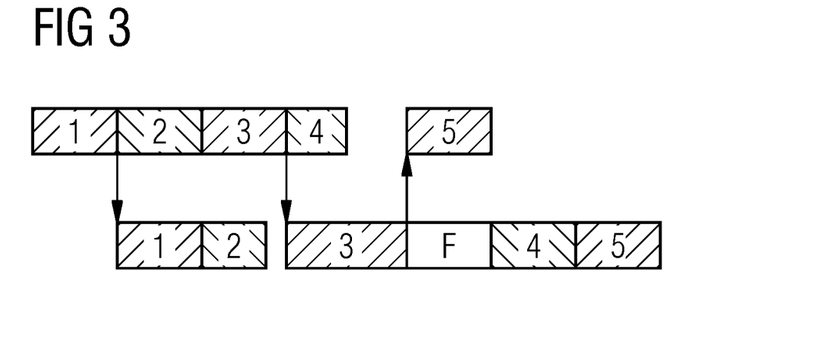
FIG. 3 shows a graphic which shows possible uses of the changing table sets.
Figure 4:
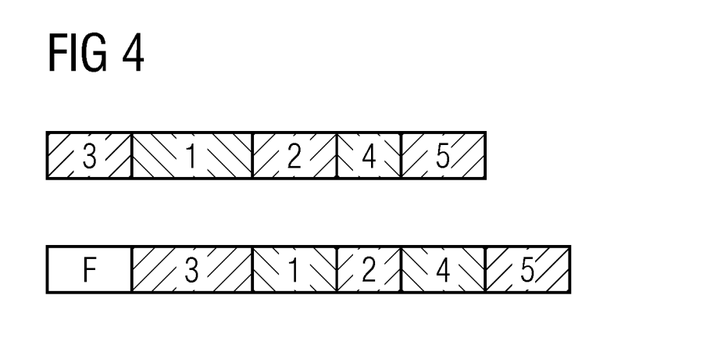
FIG. 4 shows an optimal use of the changing table sets without waiting times in the production.

In a further example according to FIGS. 3 and 4, five clusters with variant setups (V1 to V5) and one cluster with fixed setup F are to be completed on a pick-and-place line. Two changing table sets are available for the completion of the clusters with variant setups. The earliest possible time points for the beginning of setting up, the beginning of production and for the use of the changing table sets are all set to 0.

The setup times and the production times in the example can be deduced from the following table:

| Setups | Setup time in ZE | Production time in ZE |
|---|---|---|
| V1 | 3 | 2 |
| V2 | 2 | 1 |
| V3 | 2 | 3 |
| V4 | 1 | 2 |
| V5 | 2 | 2 |
| F |  | 2 |

A possible setup and production sequence 1, 2, 3, 4, 5 is shown in FIG. 3.

This begins with setting up (see first row in FIG. 3) the setup V1 on the first changing table set, which is indicated by shading to the right. Only when the setup is complete, is it possible to begin production with V1 at position 2 (see second row in FIG. 3). A downtime of 3 time units (ZE) therefore occurs on the production line.

Parallel to the production with V1, the setup V2 is already being set up on a second table set, which is indicated by shading to the left. Production with V2 can begin immediately after the production of V1 since the setup of V2 is completed in good time.

The setup of V3 is again created parallel to the production with V2. However, the production run time of V2 is shorter than the setup creation of V3 and therefore a downtime again occurs on the line before the beginning of production with V3.

The total run time is 16 time units.

An optimal setup and production sequence is shown in FIG. 4. Here the total run time is only 12 time units.

By minimizing the run time, the throughput on a pick-and-place line can be improved or optimized. Finally the production of the printed circuit boards is carried out with the aid of the sequence optimized above.

The above example is a simplified model. In reality the optimization problems are more complex. In order to solve complex optimization problems, such MILP models of the type explained above can be used.

The implementation of the previously described processes or process sequences can be accomplished by means of instructions which are provided on computer-readable storage media or in volatile computer memories (hereinafter designated in summary as computer-readable memories). Computer-readable memories are, for example, volatile memories such as caches, buffers, or RAM as well as nonvolatile memories such as removable media, hard disks, etc.

The previously described functions or steps can in this case be provided in the form of at least one instruction set in/on a computer-readable memory. The functions or steps are in this case not bound to a specific instruction set or to a specific form of instruction sets or to a specific storage medium or to a specific processor or to specific execution schemes and can be executed by software, firmware, microcode, hardware, processors, integrated circuits etc. operated alone or in any combination. In this case, most diverse processing strategies can be used, for example, serial processing by a single processor or multiprocessing or multitasking or parallel processing etc.

The instructions can be stored in local memories, but it is also possible to store the instructions on a remote system, and access them via network.

The terms "processor", "central signal processing", "control unit", or "data evaluation means" as used here comprise processing means in the broadest sense, i.e. for example, servers, universal processors, graphic processors, digital signal processors, application-specific integrated circuits (ASICs), programmable logic circuits such as FPGAs, discrete analog or digital circuits and arbitrary combinations thereof, including all other processing means known to the person skilled in the art or developed in future. Processors can in this case consists of one or more apparatuses or devices or units. If a processor consists of several apparatuses, these can be designed or configured for parallel or sequential processing or execution of instructions.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for throughput-optimized production of printed circuit boards on a pick-and-place line, wherein the printed circuit boards are divided into groups known as clusters, wherein each cluster is produced by a setup, wherein the setup is realized by changing tables that are attached to the pick-and-place line, which changing tables each have at least one feed device for holding in readiness stocks of components, wherein a quantity of changing tables needed for each setup is designated as changing table set and an empty changing table set comprises changing tables whose feed devices are empty,
   wherein a setup is set up temporarily on empty changing table sets and after production of printed circuit boards is removed as a result of the picking and placing thereof, and
   wherein one of the changing table sets can only be put into production when it has been completely set up in a pre-setup region and the changing table set can then only be set up again when the production performed with the changing table set has ended and the changing table set has been removed again in the pre-setup region,
   wherein the method comprises the following steps:
   a) recording a quantity of clusters,
   b) recording a number of empty changing table sets,
   c) recording the respective time duration for the creation of the setup for a cluster,
   d) recording the respective production time duration for the fabrication of a cluster on the pick-and-place line,
   e) selecting a sequence for use of the changing table sets for setting up in the pre-setup region with the aim of avoiding waiting times in production in which the same changing table sets are used for the production of printed circuit boards,
   f) optimizing the sequence of the clusters taking into account the selected sequence for use of the changing table sets so that the throughput on the pick-and-place line is maximized,
   g) carrying out the production of the printed circuit boards with the aid of the optimized sequence of clusters, and wherein furthermore the following steps are carried out:
   recording one or more earliest possible time points for the beginning of the use of a changing table set,
   recording an earliest possible time point for the beginning of production,
   recording an earliest possible time point for the beginning of setting up in the pre-setup region, and
   optimizing the said sequence of clusters taking into account the recorded earliest time points.

2. The method as claimed in claim 1, wherein the optimization of the sequence of clusters is performed with the aid of mixed integer linear optimization.

3. The method as claimed in claim 1, wherein different types of setups are used, wherein a first type corresponds to a fixed setup (F1, F2), which remains unchanged after a single setting up and is not removed and set up prior to production, and one changing table set is provided per fixed setup, wherein a second type corresponds to a variant setup (V1, V2, V3, V4, V5) that is varied according to the preceding claims and at least one changing table set is provided for the variant setups and wherein each cluster is fabricated with a setup of a predefinable type of the said types.

4. The method as claimed in claim 1, wherein, in addition, refitting times are recorded and taken into account for the optimization, which refitting times occur due to the changing of the changing table sets on transition from one setup to another setup.

5. The method as claimed in claim 1, wherein a cluster with a fixed setup is divided and is introduced multiple times into the sequence of clusters.

6. A control device for carrying out the method for throughput-optimized production of printed circuit boards on a pick-and-place line as claimed in claim 1, wherein the printed circuit boards is divided into groups known as clusters, wherein each cluster is produced by a setup, wherein the setup is realized by changing tables that is attached to the pick-and-place line, which changing tables each have at least one feed device for holding in readiness stocks of components, wherein a quantity of changing tables needed for each setup is designated as changing table set and an empty changing table set comprises changing tables whose feed devices are empty,
   wherein a setup is set up temporarily on empty changing table sets and after production of printed circuit boards is removed as a result of the picking and placing thereof, and
   wherein one of the changing table sets can only be put into production when it has been completely set up in a pre-setup region and the changing table set can then only be set up again when the production performed with the changing table set has ended and the changing table set has been removed again in the pre-setup region,
   wherein the control unit comprises the following recording devices
   a) for recording a quantity of clusters,
   b) for recording a number of empty changing table sets,
   c) for recording the respective time duration for the creation of the setup for a cluster,
   d) for recording the respective production time duration for the fabrication of a cluster on the pick-and-place line,
   e) for selecting a sequence for use of the changing table sets for setting up in the pre-setup region with the aim of avoiding waiting times in production in which the same changing table sets is used for the production of printed circuit boards, and f) an optimizer for optimizing the sequence of the clusters taking into account the selected sequence for use of the changing table sets so that the throughput on the pick-and-place line is maximized, as well as g) a producer for carrying out the production of the printed circuit boards with the aid of the optimized sequence of clusters, and furthermore has the following means:

for recording one or more earliest possible time points for the beginning of the use of a changing table set for recording an earliest possible time point for the beginning of production, for recording an earliest possible time point for the beginning of setting up in the pre-setup region, and for optimizing the said sequence of clusters taking into account the recorded earliest time points.

7. A computer program product, comprising a computer readable hardware storage device having computer readable program code stored therein, said program code executable by a processor of a computer system to implement the method as claimed in claim 1.

\* \* \* \* \*